(12) United States Patent
Jadus (10) Patent No.: US 9,667,264 B2
(45) Date of Patent: May 30, 2017

(54) TRANSITION TIMING CONTROL FOR SWITCHING DC/DC CONVERTER

(71) Applicant: LINEAR TECHNOLOGY CORPORATION, Milpitas, CA (US)

(72) Inventor: Brian K. Jadus, Williston, VT (US)

(73) Assignee: LINEAR TECHNOLOGY CORPORATION, Milpitas, CA (US)

( * ) Notice: Subject to any disclaimer, the term of this patent is extended or adjusted under 35 U.S.C. 154(b) by 0 days.

(21) Appl. No.: 14/733,932

(22) Filed: Jun. 8, 2015

(65) Prior Publication Data

US 2015/0365097 A1   Dec. 17, 2015

Related U.S. Application Data

(60) Provisional application No. 62/011,670, filed on Jun. 13, 2014.

(51) Int. Cl.
| | |
|---|---|
| *G05B 24/02* | (2006.01) |
| *H03M 1/08* | (2006.01) |
| *H03M 1/12* | (2006.01) |
| *G05F 1/56* | (2006.01) |

(52) U.S. Cl.
CPC ........... *H03M 1/0836* (2013.01); *G05F 1/56* (2013.01); *H03M 1/1255* (2013.01)

(58) Field of Classification Search
CPC ........ H02M 3/156; H02M 1/44; H02M 3/158; H02M 3/33507; H02M 1/08; H02M 2001/0003; H02M 1/14; H02M 1/36; H02M 2001/0041
USPC .................. 323/351, 318, 288, 283; 341/155
See application file for complete search history.

(56) References Cited

U.S. PATENT DOCUMENTS

| | | | | |
|---|---|---|---|---|
| 6,719,435 | B2* | 4/2004 | Nakamura | H02M 1/14 341/50 |
| 7,710,092 | B2* | 5/2010 | Chapuis | H02M 3/157 323/282 |
| 8,587,281 | B2* | 11/2013 | Saito | H02M 3/156 323/282 |
| 2004/0075600 | A1* | 4/2004 | Vera | H02J 1/102 341/166 |
| 2007/0159372 | A1* | 7/2007 | Weng | A61B 5/053 341/156 |

(Continued)

OTHER PUBLICATIONS

"18-Bit, 1Msps, Low Power SAR ADC With 102dB SNR," LTC2378-18, Linear Technology, 2011, pp. 1-24.

(Continued)

*Primary Examiner* — Linh Nguyen
(74) *Attorney, Agent, or Firm* — McDermott Will & Emery LLP (57) ABSTRACT

A device is configured to control a transition timing of a switching DC/DC converter for providing power to a load device. The load device has a first operational phase that is sensitive to external noise and a second operational phase that is immune to the external noise. The device includes an input terminal coupled to an external device to receive a start signal of the first operational phase for the load device. The device also includes control circuitry configured to, responsive to the start signal, control a transition frequency of the DC/DC converter to avoid transitioning an output of the switching DC/DC converter during the first operational phase.

16 Claims, 8 Drawing Sheets

(56) References Cited

U.S. PATENT DOCUMENTS

| | | | |
|---|---|---|---|
| 2008/0089532 A1* | 4/2008 | Lee ........................ | H03F 1/305 381/94.5 |
| 2009/0040791 A1* | 2/2009 | Qahouq .............. | H02M 3/1588 363/21.01 |
| 2010/0102642 A1* | 4/2010 | Odaohhara ........... | H02M 3/158 307/125 |
| 2011/0179298 A1* | 7/2011 | Odaohhara ............... | G06F 1/26 713/323 |
| 2012/0223768 A1* | 9/2012 | Higuchi .................. | H03K 5/04 327/551 |
| 2012/0286752 A1* | 11/2012 | Tsukiji .................. | H02M 3/156 323/282 |
| 2013/0049713 A1* | 2/2013 | Ogawa ................ | H03M 1/1019 323/234 |
| 2013/0083951 A1* | 4/2013 | Majidzadeh Bafar | H03M 1/125 381/320 |
| 2013/0322134 A1* | 12/2013 | Kondo .................. | H02M 1/126 363/39 |
| 2014/0253223 A1* | 9/2014 | Meehan ............... | H03K 17/161 327/530 |

OTHER PUBLICATIONS

"100mA, Low Noise, LDO Micropower Regulators in TSOT-23," LT1761 Series, Linear Technology, 2005, pp. 1-22.

* cited by examiner

TRANSITION TIMING CONTROL FOR SWITCHING DC/DC CONVERTER

CROSS-REFERENCE TO RELATED APPLICATION

The present application claims priority from provisional patent application No. 62/011,670 filed on Jun. 13, 2014, the entire contents of which are hereby incorporated by reference.

TECHNICAL FIELD

The subject matter of the disclosure relates generally to transition timing control of a switching DC/DC converter, and more particularly to transition timing control to avoid injecting noise from the DC/DC converter to a load such as an analog to digital converter, when the load is in a condition susceptible to the noise.

DESCRIPTION OF RELATED ART

A sampling system such as used in an Analog to Digital Converter (ADC) designed without any means to synchronize power system transients to be outside of a sensitive time window may corrupt the result of a sensitive measurement. A sensitive time window is defined as a portion of time when a critical process operates in which, if noise is present, the result of the critical process may be in error. The magnitude of the error has a relationship to the magnitude of the noise injected into the system. The significance of the error is relative to an application. The sensitive time window for the ADC, for example, is at the end of the acquisition phase when the analog signal is sampled and during the phase the sampled analog signal is converted into a digital result. Analog errors during sampling (end of acquisition) are a direct error in the expected input signal. After the signal is sampled, noise injected into the power and ground supplies or the reference voltage to the ADC can affect bit by bit conversions in certain types of ADCs.

A sensitive time window can be defined for other analog circuit functions where a sample and process phase exists. Timing can be defined for a DC/DC converter, such that transitions occur during a period when the noise injected settles before being processed.

When the DC/DC converter and an ADC conversion start signal are asynchronous, power transitions can occur at any point within the sampling or conversion window. In an example of the ADC, the time point at which the input signal is sampled is sensitive to direct injection of noise. The injected noise is sampled and converted into the result, creating an error. Further, depending on the topology of the ADC, the steps of converting the sampled input into a digital output result may be sensitive to noise on reference voltages and power supply and ground connections.

Implementation of an ADC is well known, for example in commercially available LTC2378-18, manufactured by Linear Technology Corporation, and described in its corresponding datasheet, incorporated herein by reference. Conversion of the ADC may be controlled by a conversion start signal. A rising edge on the signal will start a conversion and power up the ADC. Converter status is indicated by a BUSY signal which remains high while the conversion is in progress. Once the conversion has completed, the ADC can power down and begin acquiring the input signal. The ADC automatically powers down after a conversion has been completed and powers up once a new conversion is initiated on the rising edge of the conversion start signal. During power down, data from the last conversion can be clocked out.

Figure 1:
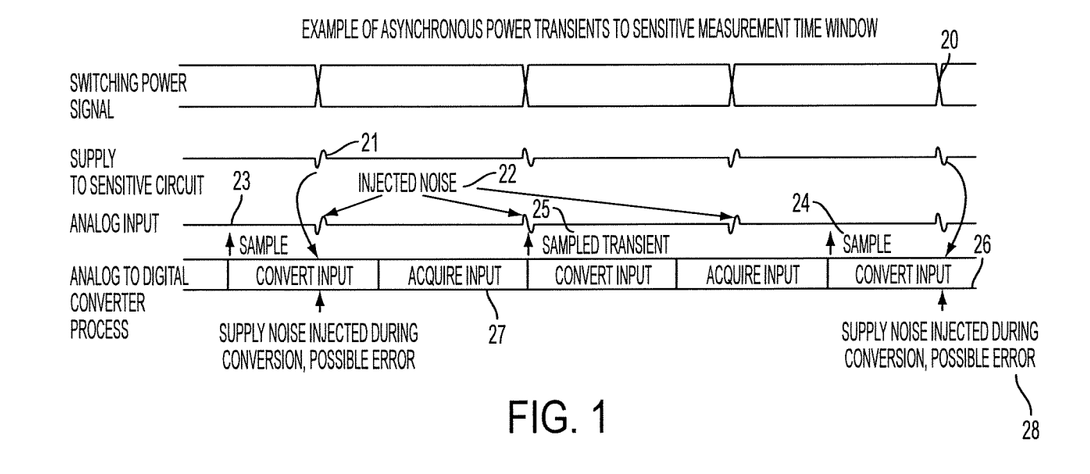
FIG. 1 is a timing diagram showing an effect of noise in an asynchronous example of the DC/DC converter and the ADC.

FIG. 1 shows a timing diagram displaying an effect of noise in an asynchronous example of the DC/DC converter and the ADC. As shown in FIG. 1, the ADC has an input converting phase 26 and input acquiring phase 27 (in which a sensitive time window exists) which are performed alternatively. When a power supply 20 from the DC/DC converter is transitioned, noise 21 is injected into the ADC, causing noise 22 to be injected into an analog input 23 to be sampled by the ADC. As discussed above, when analog input 23 having injected noise 22 is sampled, the noise is included in a digital output which results in an error. Noise 21 injected into the power supply to the ADC during the input converting process 26 can affect conversions by the ADC. For example, since the ADC as such LTC2378-18 can power down during input acquiring process 27, such an ADC may not be affected by injected noise 21 and 22 during that phase as long as the noise settles before the end of the acquisition phase.

One prior method of noise reduction includes a synchronizing input to the DC/DC converter design for an external controlling device to manage. The external controlling device controls the synchronizing input and the beginning of the sensitive timing window with a separate signal. This technique works when a DC/DC converter frequency is lower than the frequency of the sensitive timing window and requires an external routine to pre-emptively control the synchronizing pulse before the initiation of a sensitive timing window. The synchronizing input forces the DC/DC converter to transition or start transition periods at the synchronizing input state change. The sensitive window start will be initiated after the DC/DC converter noise settled.

However, this approach has difficulty with instantaneous requests. The synchronizing pulse generally sets up the power converter to be in a quiet mode when the processing of a sensitive time window is required. If a request for sensitive processing occurred without prior knowledge, the location of transients is unknown and may occur at the same time as the beginning of the sensitive time window.

A second prior method of noise reduction is to decouple and filter the noise from the DC/DC converter, avoiding the issue of synchronizing the relationship between the DC/DC converter transitions and the sensitive time window. Proper decoupling and filtering require careful design and may involve large numbers and large values of capacitors, resistors, inductors, and/or ferrites. This approach, however, consumes excess area and impacts cost.

A modification of the second method is to impart slow slew rate operation of the DC/DC converter. With the slow slew rate, the transient noise is greatly reduced. However, this consumes power during slow slew rate transitions, reducing power efficiency.

Another approach simply implements lower frequency AC power conversion. However, this approach consumes a large area and impacts cost.

SUMMARY OF DISCLOSURE

The present subject matter discloses controlling a transition timing of a switching DC/DC converter for providing power to a load device. The load device has a first operational phase that is sensitive to external noise and a second operational phase that is immune to the external noise. An input terminal is coupled to an external device to receive a start signal of the first operational phase for the load device. Control circuitry, responsive to the start signal, controls a switching frequency of the DC/DC converter to avoid transitioning an output of the switching DC/DC converter during the first operational phase.

Additional aspects and advantages of the present disclosure will become readily apparent to those skilled in the art from the following detailed description, wherein only exemplary embodiments of the present disclosure is shown and described, simply by way of illustration of the best mode contemplated for carrying out the present disclosure. As will be realized, the present disclosure is capable of other and different embodiments, and its several details are capable of modifications in various obvious respects, all without departing from the disclosure. Accordingly, the drawings and description are to be regarded as illustrative in nature, and not as restrictive.

DESCRIPTION OF THE EMBODIMENT

Figure 2:
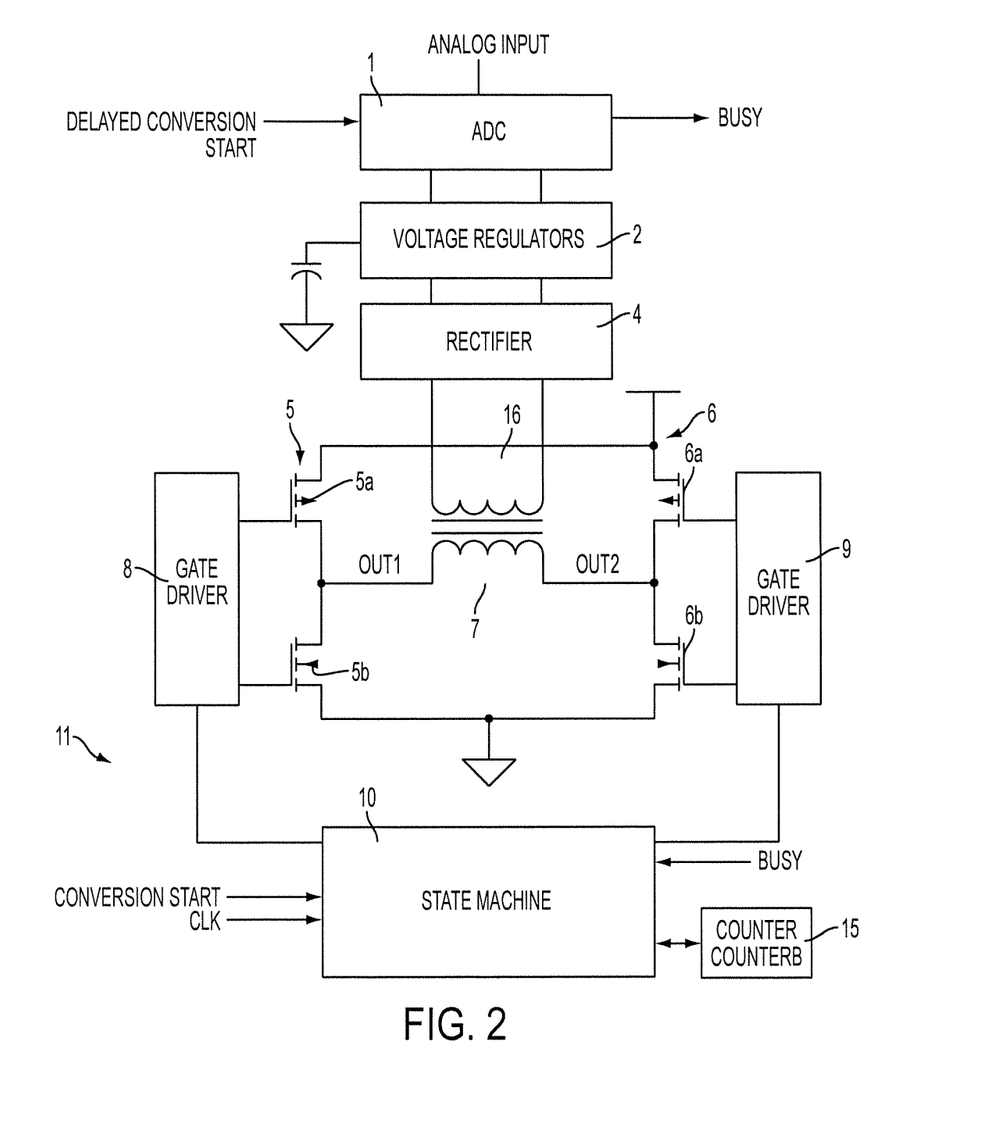
FIG. 2 shows an exemplary system architecture of an implementation of one example of the present disclosure.

FIG. 2 shows an exemplary system architecture of an implementation of one example of the present disclosure. The present disclosure describes reducing injected noise from a high edge rate transition of a switching DC/DC converter 11 into a circuit such as analog to digital converter (ADC) 1 that has a window of time where it samples and processes a signal when the result can be affected by the injected noise. The present example adjusts the time when DC/DC converter 11 transitions its output to avoid injecting noise into ADC 1 while it is in process of sampling the signal or processing the result. This requires that there exist a time window that is sensitive to injected noise and a time window that is immune to injected noise (see FIG. 2).

In one example, the window of time when quiet is necessary relates to ADC 1 completing a conversion of an analog input signal in which noisy transients in the ground or power supply may cause errors in the conversion result. Further, ADC 1 is sensitive to noise at the moment an analog input is sampled, at the beginning of the sensitive time window. A switching power supply is one source of noisy transients in ground and power supplies.

The current example applies to a function containing transformer based DC/DC converter 11 for isolated power, an isolated data communication function, and ADC 1.

A signal that initiates the sensitive time window is implemented to immediately change the characteristics of DC/DC converter 11 and delay any transitions in DC/DC converter 11 until the sensitive time window has elapsed. The instantaneous change of frequency characteristics of DC/DC converter 11 avoids transitions during the sensitive time window, and timing functions control and maintain balance of the transformer element in the power path of DC/DC converter 11. As a result, there can be reduced area and component count, smaller magnetics at higher frequencies, and lower value and smaller decoupling capacitors. Decoupling capacitance is reduced to requirements of downstream components and not oversized for power supply noise filtering. The requirement to slow down the slew rate on the DC/DC converter signal edges is reduced. With a faster slew rate, there are lower slew control current losses and better efficiencies. Isochronous requests, for measurements requiring a sensitive time window, generally stabilize DC/DC converter 11 into a fixed frequency.

As shown in FIG. 2, one exemplary system may include DC/DC converter 11, rectifier 4, voltage regulators 2, and ADC 1. DC/DC converter 11 may be a full H-Bridge driver of a transformer for the purpose of generating a power supply for ADC 1. DC/DC converter 11 may include a state machine 10 for controlling gate drivers 8 and 9 to turn on and off output stages 5 and 6, respectively. Output stage 5 has transistors 5a and 5b, and output stage 6 has transistors 6a and 6b. Output signals OUT1 and OUT2 can be obtained between transistors 5a and 5b and between transistors 6a and 6b, respectively. Output signals OUT1 and OUT2 are provided to ADC 1 through rectifier 4 and voltage regulators 2.

Rectifier 4 can be any type of rectifiers such as a diode bridge (not shown). Implementation of voltage regulators 40 is well known, for example in commercially available LTC1761, manufactured by Linear Technology Corporation, and described in its corresponding datasheet, incorporated herein by reference. As mentioned above, ADC 1 can be implemented, for example, by commercially available LTC2378-18, manufactured by Linear Technology Corporation.

DC/DC converter 11 drives transformer 7 in a full wave configuration supplying power to ADC 1. DC/DC converter 11 drives complementary square waves into transformer primary 7 at a controlled frequency. The secondary of transformer 16 is connected to rectifier 4 and voltage regulators 2. The output of the voltage regulators 2 supplies power and ground to ADC 1.

In this example, the time delay of DC/DC converter 11 is controlled after a CONVERSION START signal from an external controller becomes high. The time delay adjusts the frequency of DC/DC converter 11 for one cycle. DC/DC converter 11 may include a digital state machine 10 and counter 15 to manage the time delay and frequency of the drive signals to gate drivers 8 and 9, and output stages 5 and 6 to transformer primary input 7. State machine 10 and counter 15 are driven by a clock signal CLK, and monitor the CONVERSION START signal and the BUSY signal. The status of ADC 1 is indicated by the BUSY signal which remains high while the conversion is in progress (sensitive time window). Counter 15 may include a main counter and an additional counter, as discussed in relation to FIG. 8.

Counter 15 may be a digital counter. Counter 15 may also be implemented by an analog integrator counter having a capacitor to be charged up to a voltage threshold. Transitions of the phase of the DC/DC converter occur when the charge of the capacitor reaches the voltage threshold.

The input acquiring phase and the input converting phase of ADC 1 are controlled by a DELAYED CONVERSION START signal that is a delayed version of the CONVERSION START signal to state machine 11. The purpose of the DELAYED CONVERSION START signal is to allow time to process an incoming CONVERSION START signal and affect the timing of DC/DC converter 11 such that transitions in an undesirable location do not occur.

State machine 10 compares the value of counter 15 at the time when the CONVERSION START signal is received, to decide where to place the next DC/DC converter switching edge of output signals OUT1 and OUT2. Output signals OUT1 and OUT2 are outputs of DC/DC converter 11 into transformer 7 or other power transferring device. A "1" on output signal OUT1 or OUT2 represents a high voltage drive signal to transformer 7, and a "0" on output signal OUT1 or OUT2 represents a low voltage drive signal to the transformer. State machine 11 uses the counter value of counter 15 to decide whether delay needs to be added to counter 15 and how much delay is added to the counter. The decision is made based on the length of the sensitive time window and the minimum and maximum frequency properties of the transformer.

Figure 3:
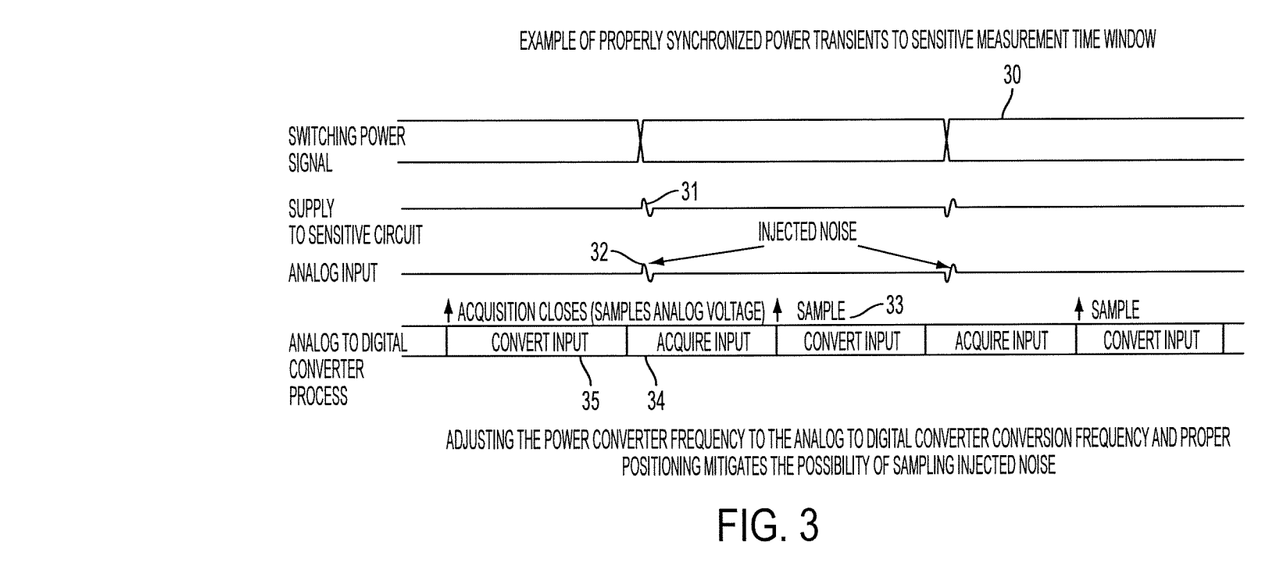
FIG. 3 is a timing diagram showing power transients synchronized into safe regions of time according to one example of the present disclosure.

FIG. 3 shows an example of a timing diagram where transitions of a DC/DC switching power signal 30 are placed in time, during the acquisition of the input signal (input acquiring phase 34), where enough time exists to settle noise 31 and 32. The goal of synchronizing power signal transition, with knowledge of the impact on a supply to sensitive circuits (i.e., ADC 1) and the impact to an analog input, is to place noise 31 and 32 at a time region that will settle before ADC 1 samples the analog input. This can avoid injecting noise shown in FIG. 3 during the sensitive time window defined by a sample point 33 and an input converting phase 35.

Figure 4:
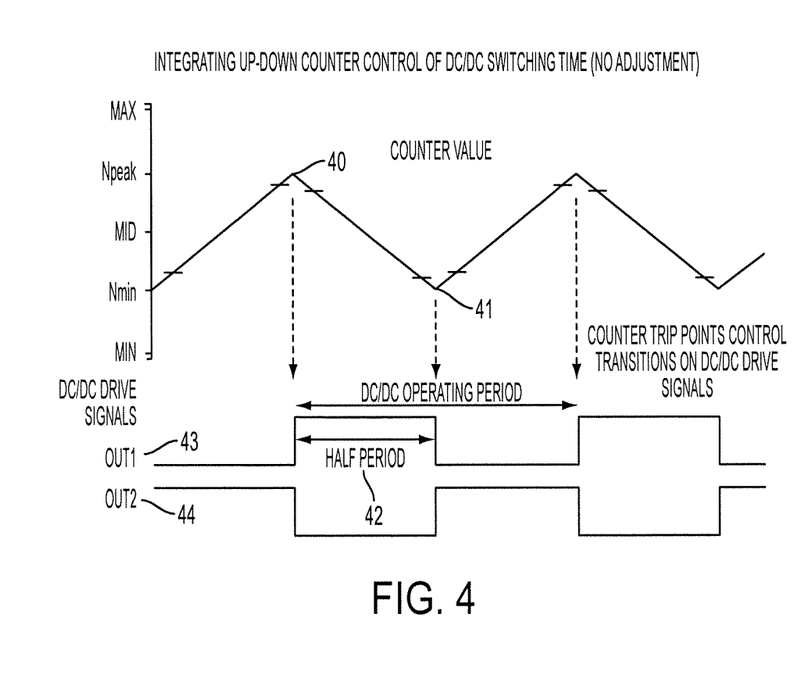
FIG. 4 shows a transition timing of the DC/DC converter according to one example of the present disclosure.

FIG. 4 shows the timing and counter functions used in state machine 10 to control gate drivers 8 and 9. This example shows the case without any interruption or adjustment from the CONVERSION START signal. State machine 10 enables counter 15 to count in a counter direction, up or down, based on a counter value.

If the counter value of counter 15 is Nmin 41 in FIG. 4, the direction to count goes upwards toward Npeak 40. If the counter value is Npeak 40, the direction goes down toward Nmin 41. The counter values Nmin 41 and Npeak 40 indicates transition points for gate drivers 8 and 9 for controlling output signals OUT1 and OUT2. A half period 42 of the operational frequency of DC/DC converter 10 is indicated as equal to the time to count from Npeak 40 to Nmin 41, and the half period is equal counting from Nmin 41 to Npeak 40. The operating frequency of DC/DC converter 11 is equal to 1/(2*half period).

One goal of DC/DC converter 11 for driving transformer 7 is to maintain a DC balance in a transformer core to maintain operation without core saturation. Maintaining the half period when output signal OUT1 is high and output signal OUT2 is low, equal to the half period when output signal OUT1 is low and output signal OUT2 is high, can maintain DC balance on the transformer core.

Figure 5:
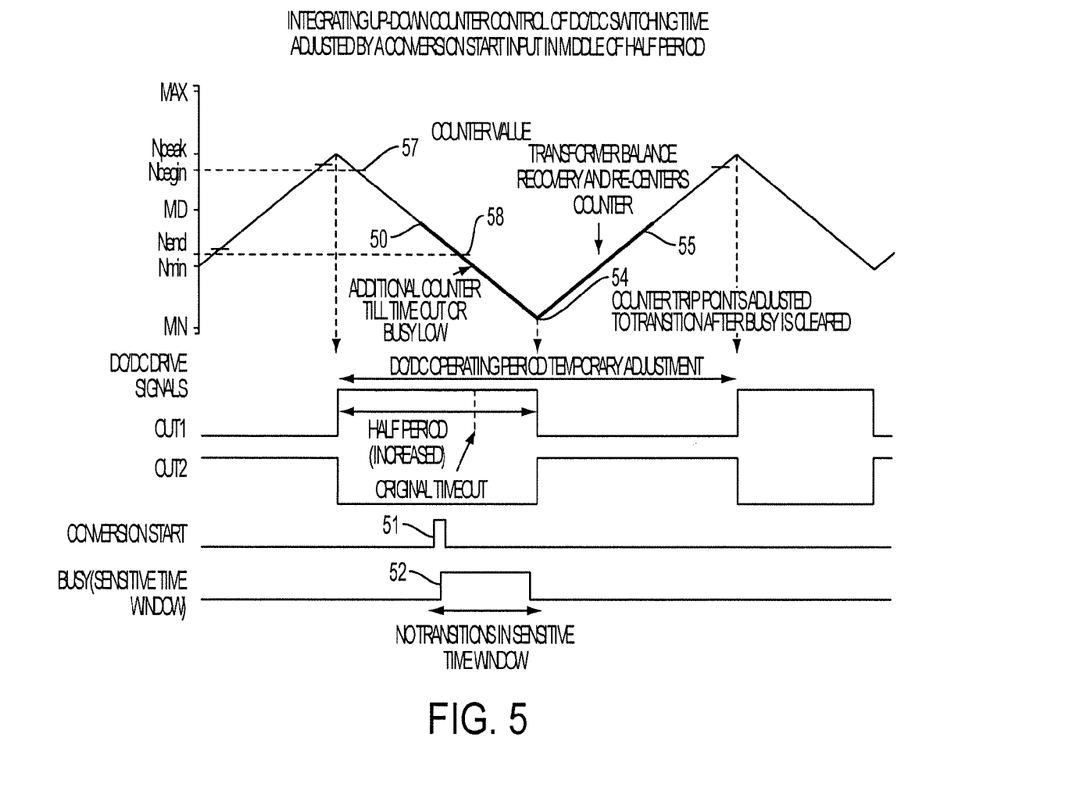
FIG. 5 shows a transition timing of the DC/DC converter according to Case 1 of the present disclosure.

FIG. 5 shows the timing and counter functions of state machine 10 if the CONVERSION START signal becomes high when the value of counter 15 indicates a value (50) between counter reference markers Nbegin (57) and Nend (58). Time corresponding to the value to be counted between counter reference Nbegin (57) and counter reference Nend (58) are substantially equal to the critical window of ADC 1. State machine 10 compares the counter value of counter 15 to counter references Nbegin (57) and Nend (58) when the CONVERSION START signal becomes high (51). In response, the operation of ADC 1 enters the input converting phase (sensitive time window) and outputs the BUSY signal during that phase (52). State machine 10 makes a decision based on this comparison on a transition timing of an output of DC/DC converter 11. There are Cases 1-3 in this example, which are patterns of controlling DC/DC converter 11.

In Case 1, if the CONVERSION START signal becomes high (51) between counter reference marker Nbegin (57) and counter reference marker Nend (58), state machine 10 adds a fixed value to counter 15 to count the time beyond the sensitive time window. Time corresponding to the value to be counted by counter 15 corresponds to the sensitive time window of ADC 1.

In Case 2, if the CONVERSION START signal becomes high (51) before counter 15 reaches reference marker Nbegin (57), the sensitive time window can end before counter 15 reaches counter value Nmin (58). State machine 10 does not change the transition timing of DC/DC converter 11.

In Case 3, if the CONVERSION START signal 51 becomes high (51) after counter reference marker Nend (58), a small fixed delay is added to counter.

Case 1 will be discussed in more detail below. As shown in FIG. 5, when the CONVERSION START signal becomes high (51) and when the counter value (50) indicates a value between counter reference marker Nbegin (57) and counter reference marker Nend (58), state machine 10 adds an additional count to counter 15 that is longer than the specified ADC conversion time. At the end of the additional count, the counter direction changes and outputs OUT1 and OUT2 are switched. Counter 15 stores that additional count which is also counted in the next half period, as shown in FIG. 5 (see a bold line). When counter 15 counts back to the next transition point marked by Npeak in FIG. 5, this additional time may also extend counts in the subsequent half period in the same manner as the previous half period. This results that the two half periods become equal to each other, and the frequency is reduced by the extension of the two half periods for the current cycle.

Alternatively, state machine 10 may monitor the BUSY signal and cause counter 15 to continue counting until the BUSY signal becomes low (52). When the BUSY signal becomes low, state machine 10 transitions output signals OUT1 and OUT2, and changes the counting direction of counter 15. The counter stores the additional time during which output signals OUT1 and OUT2 maintains their states, which extends the count of the next half period. When the counter counts back to the next transition point marked by Npeak, the half periods will become equal to each other. The frequency is reduced by the extension of the two half periods for the current cycle.

Figure 6:
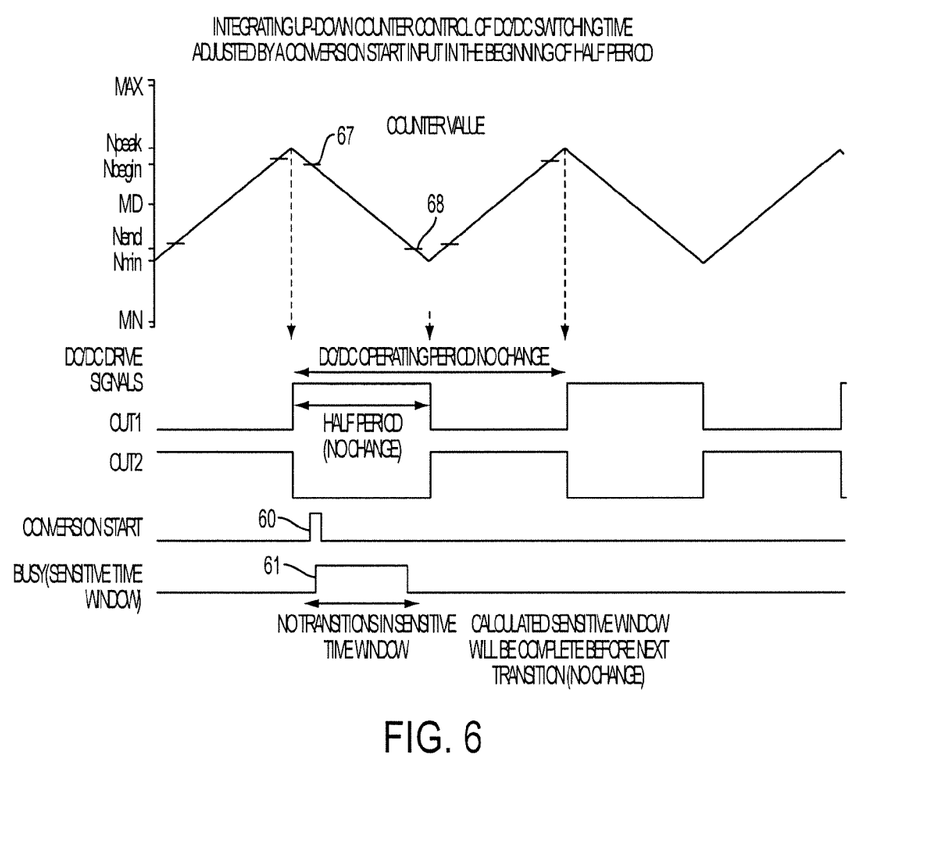
FIG. 6 shows a transition timing of the DC/DC converter according to Case 2 of the present disclosure.

FIG. 6 shows the timing and counter functions of state machine 10 when the CONVERSION START signal becomes high near the beginning of a new counter cycle, before counter reference marker Nbegin (67) (Case 2). State machine 10 compares the counter value of counter 15 to counter reference markers Nbegin (67) and Nend (68) when the CONVERSION START signal becomes high (60). If the counter value does not reach counter reference marker Nbegin (67), there is enough time to complete the conversion cycle before the next transition. Counter reference marker Nbegin (67) is the counter comparison value closest to the prior Npeak or Nmin. The value of counter reference Nbegin (67) is chosen to allow the longest possible conversion time for a specific ADC or longest possible sensitive time window. In this case, the half period time is not extended and a frequency shift does not occur.

Figure 7:
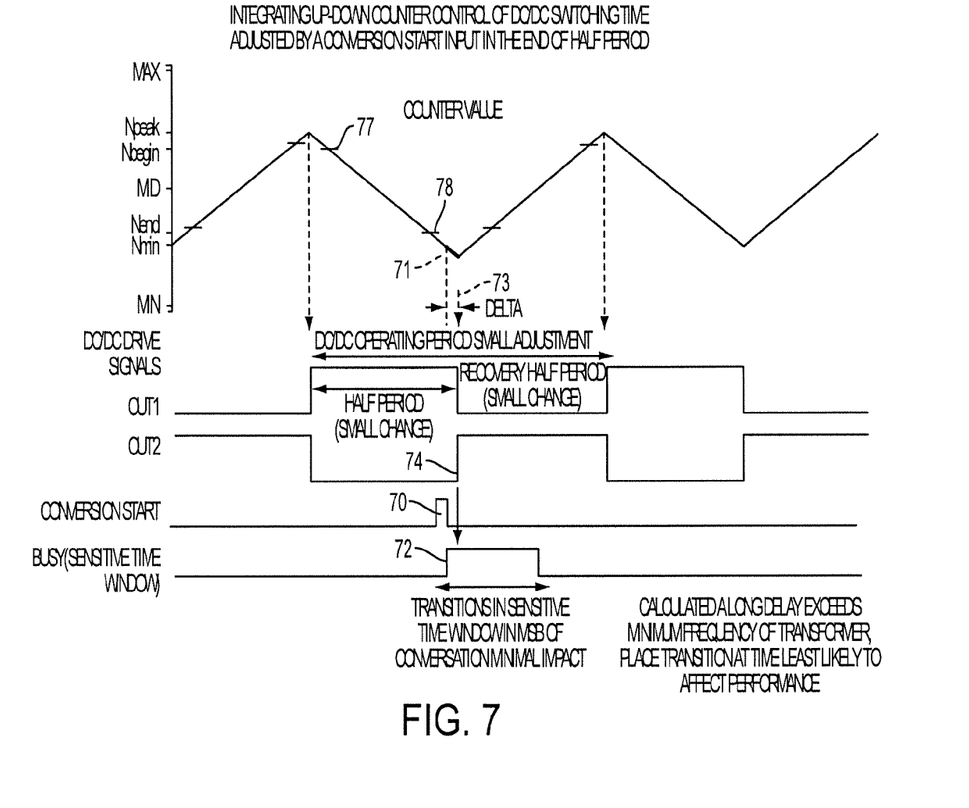
FIG. 7 shows a transition timing of the DC/DC converter according to Case 3 of the present disclosure.

FIG. 7 shows the timing and counter functions of state machine 10 when the CONVERSION START signal becomes high near the end of the counter cycle after counter reference marker Nend (78). State machine 10 compares the value of counter 15 to counter references markers Nbegin (77) and Nend (78) when the CONVERSION START signal becomes high (70). If the CONVERSION START signal becomes high when the counter value does not reach counter reference marker Nend (78), state machine 10 makes the decision to place the converter transition at a specific time delay into the sensitive time window. The time delay can be adjustable in order to optimize the location of the power converter transition. The transition timing can be placed at a certain moment of the sensitive time window, but an effect of the transition should be placed where the impact is a minimum. In FIG. 7, the transition in the sensitive time window in relation to a conversion of the most significant bit (MSB) may have less impact on the digital result. Many high resolution ADCs will recover small errors made in the conversion of the most significant bits with mathematical algorithms in the conversion routine.

The reason for the placement of the transition within the sensitive time window is that the power converter may need to transition at some point in order not to decrease the overall frequency below a defined limit. Under the condition that the conversion start frequency is consistent, the power converter frequency will be reduced by a small amount. Under the condition that the prior transition is extended by a conversion time as shown in FIG. 5 (Case 1), and the next conversion start initiates at the end of the extended recovery half period, the power converter frequency will be significantly extended without forcing a transition. This function limits the lower operating frequency of the power converter. It is noted that counter values Max, Npeak, Nmin, and Min shown in FIGS. 4-7 are determined in order to limit the lower operating frequency of the DC/DC converter. Counting from Nmin to Max or Npeak to Min is the longest half period allowable in the system.

Figure 8:
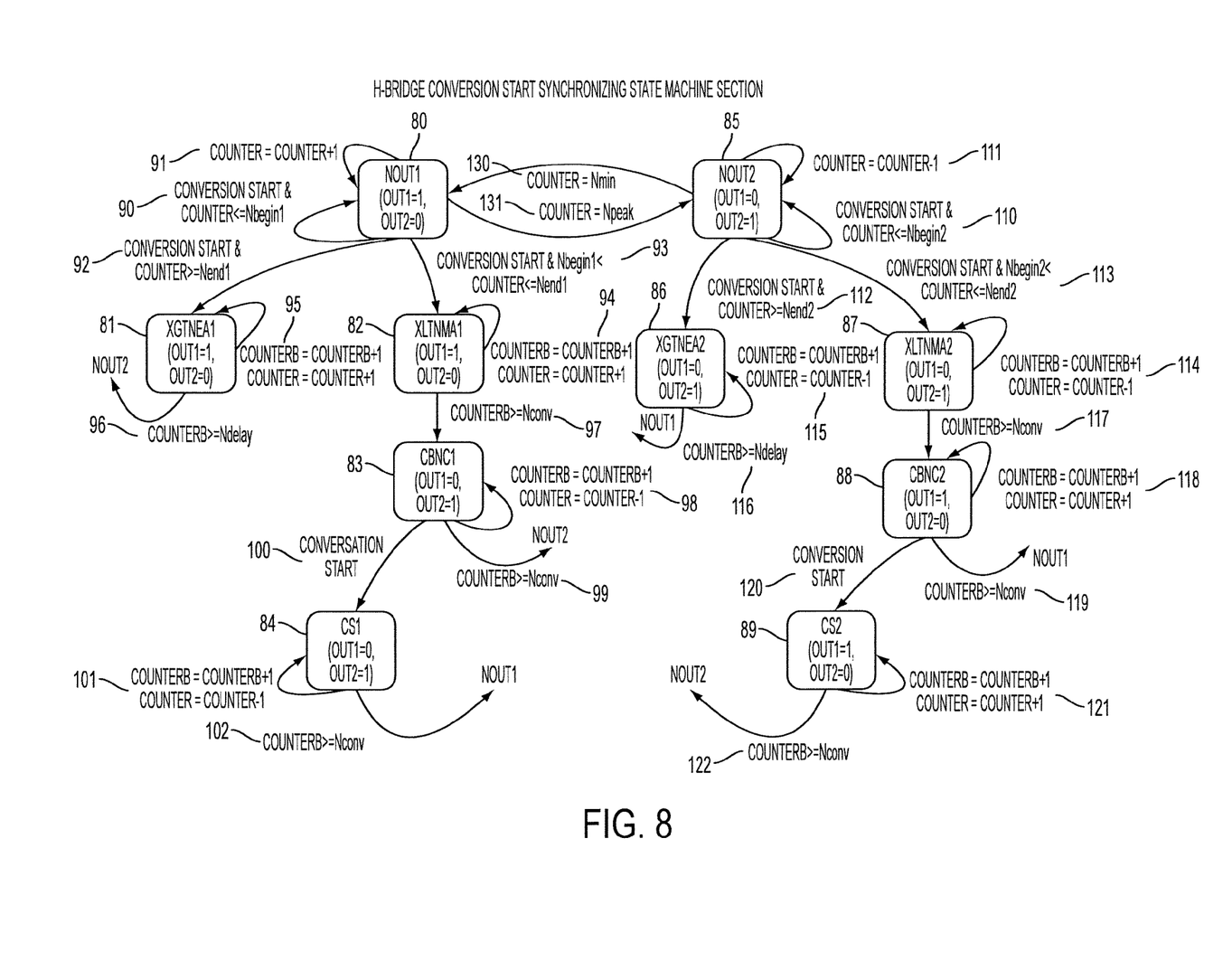
FIG. 8 is a state diagram showing decisions based on input signal and counter values.

FIG. 8 shows a state diagram of state machine 10 and paths taken due to the counter comparisons. The normal operating mode as shown in FIG. 4, follows the path from state NOUT1 80 to state NOUT2 85 through counter comparison to Nmin and Npeak. In this case, starting at state NOUT1 80, counter 15 increments (path 91) until it reaches Npeak (path 131), and then transitions to state NOUT2 85. Output signals OUT1 and OUT2 are controlled by which state the state machine is in. Counter 15 will then decrement (path 111) until it reaches Nmin (path 130), and then transition to state NOUT1 80. The states toggle between state NOUT1 80 and state NOUT2 85 until the CONVERSION START signal becomes high.

Case 2, where the CONVERSION START signal becomes high before counter 15 reaches counter reference Nbegin (see FIG. 6, (67)), is shown in FIG. 8 as path 90 "conversion start & counter<=Nbegin1" when state machine 10 is in state NOUT1 80. A complementary path is shown as path 110 "conversion start & counter<=Nbegin2" when state machine 10 is in state NOUT2 85.

Case 3, where the conversion start signal becomes high near the end of the counter (see FIG. 7, (71)), shown in FIG. 8 as path 92 "conversion start & counter>=Nend1," transitions from state NOUT1 80 to state XGTNEA1 81. Complementary path 112 exists as "conversion start & counter>=Nend2" transitions from state NOUT2 85 to state XGTNEA2 86. In state XGTNEA1 81, an addition counter, counterb is utilized to count an additional count Ndelay, which is the added time delay discussed in FIG. 7, together with a main counter discussed as counter 15 above. The additional counter, counterb, increments a counter value (paths 95 and 115). When the counterb reaches counter value Ndelay, the state transitions through path 96 or 116 "counterb>=Ndelay" 96 or 116, and return to state NOUT1 80 or state NOUT2 85. The main counter counts in the manner as shown in FIG. 7.

When conversion start signal becomes high in the middle of the counter references, i.e., between counter references Nbegin and Nend (see FIG. 5), Case 1 is applicable as shown in FIG. 8, path 93 "conversion start & Nbegin1<counter<=Nend1" from state NOUT1 80 to state XLTNMA1 82. A complementary path exists from state NOUT2 85 to state XLTNMA2 87 through path 113 "conversion start & Nbegin2<counter<=Nend2." At state XLTNMA1 82 or state XLTNMA2 87, the additional counterb increments a count (path 94 or 114) toward a value equal to conversion time Nconv of ADC 1 or length of the sensitive time window (path 97 or 117). The value of conversion time Nconv can be a fixed hardwired value for a specific device or adjustable by an end user for flexibility. The main counter continues to count (path 94 or 114), which stores the additional recovery time needed to rebalance both half periods (current half period and subsequent half period).

When the additional counterb reaches conversion time Nconv, the state transitions through path 97 "counterb>=Nconv" to state CBNC1 83 or its complement path 117 "counterb>=Nconv" to state CBNC2 88. While in state CBNC1 83, output signals OUT1 and OUT2 transition their values, the main counter decrements, and the additional counterb increments (path 98). If in complement state CBNC2 88, the state also transitions the value of output signals OUT1 and OUT2 along with changing the direction of the main counter and incrementing the value of the additional counterb. The additional counterb counting conversion time Nconv controls the transition back to main opposing state NOUT1 80 or NOUT2 85. State CBNC1 83 transitions to state NOUT2 85 and state CBNC2 88 transitions to state NOUT1 80 after the additional counterb reaches conversion time Nconv.

If a new conversion start occurs before the additional counter reaches conversion time Nconv, state CBNC1 83 transitions to state CS1 84 through path 100 "conversion start." State CS1 adds full conversion time Nconv to the additional counterb and the main counter before returning to state NOUT1 80. If state machine 10 is in complement state CBNC2 88 and the conversion start signal becomes high before the additional second counterb reaches conversion time Nconv, the state transitions to state CS2 89 through conversion start path 120. State CS2 89 adds full conversion time Nconv to the additional counterb and the main counter prior to transitioning to state NOUT2 85.

Alternatively, the BUSY signal going low can be used as a replacement of conversion time Nconv timeout during states XLTNMA1, XLTNMA2, CS1, and CS2. The BUSY signal is a direct response to the completion of the ADC conversion. Counter 15 maintains the recovery time for the subsequent half period.

Aspects of the inventive concepts described herein thus include a switching converter such as a DC/DC or ADC conversion system having a sensitive time window during which converter output signal transitions tend to produce electrical noise, in which methodology/circuitry is carried out/configured for avoiding converter transition during the sensitive time window, during sampling or processing when noise may affect conversion accuracy.

In accord with an example, the methodology/circuitry is operative for delaying conversion time or start of the sensitive time window to a window of time immune to injected noise to avoid conversion during the sensitive time window.

The methodology/circuitry may be further operative to adapt converter operating frequency to a signal initiating the time sensitive window.

The above-discussed example of the present disclosure may be implemented in a DC/DC converter driving a transformer in a full wave configuration supplying power to an ADC.

State machine 10 may be implemented to control system operations. For example, state machine 10 can be implemented by circuitry including, but not limited to, at least one semiconductor integrated circuit such as at least one processor (e.g., a central processing unit (CPU)), and at least one custom IC including an application specific integrated circuit (ASIC), and a field programmable gate array (FPGA). At least one processor can be configured, by reading one or more instructions from at least one machine readable tangible medium, to perform all or a part of functions described in FIG. 8. Such a medium may take many forms, including, but not limited to, any type of magnetic medium such as a hard disk, any type of optical medium such as a CD and a DVD, any type of semiconductor memory such as a volatile memory and a non-volatile memory. The volatile memory may include a DRAM and a SRAM, and the nonvolatile memory may include a ROM and a NVRAM. The semiconductor memory is also a semiconductor circuit which can be a part of the circuitry together with at least one processor. The ASIC is an integrated circuit (IC) customized to perform, and the FPGA is an integrated circuit designed to be configured after manufacturing in order to perform, all or a part of the functions of the elements shown in FIG. 8.

The methodology/circuitry may be further operative to rebalance discharge excess energy stored in the converter or transfer device following occurrence of a half period extension.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents. Notwithstanding, none of the claims are intended to embrace subject matter that fails to satisfy the requirement of Sections 101, 102, or 103 of the Patent Act, nor should they be interpreted in such a way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

What is claimed is:

1. A DC/DC converter for providing power to a load device, the load device having a first operational phase that is sensitive to external injected noise and a second operational phase that is immune to the external injected noise, the DC/DC converter comprising:
   a coil;
   a switch for controlling current in the coil;
   a first input terminal that receives a start signal of the first operational phase for the load device; and
   control circuitry, responsive to the start signal, for controlling the switch to avoid switching by the switch during the first operational phase;
   wherein the switch controls the frequency of the current to the coil;
   further comprising a counter to increment or decrement a counter value during a half period of the switching frequency of the switch, the switching frequency being 1/(2×half period); and
   wherein the control circuitry is, responsive to the start signal, to compare the counter value with reference values to control the switching frequency of the switch.

2. The DC/DC converter according to claim 1, wherein the reference values include first and second reference values which are values between a start value and an end value, the counter being configured to increment or decrement the counter value from the start value to the end value, a difference between the first value to the second value is set based on the first operational phase, and the start value, the first reference value, the second reference value, and the end value have a following relationship:

the start value<the first reference value<the second reference value<the end value, if the counter increments a counter value, and the start value>the first reference value>the second reference value>the end value, if the counter decrements a counter value, and the control circuitry is configured to:

switch the switch to transition the output of the switching DC/DC converter when the counter value reaches the end value, and responsive to the start signal, compare the counter value with first and second reference values to determine whether to delay the switching timing of the switch.

3. The DC/DC converter according to claim 2, wherein, when the counter value indicates a value between the start value and the first reference value, the control circuitry is operative not to delay the switching timing of the switch.

4. The DC/DC converter according to claim 2, wherein when the counter value indicates a value between the first reference value and the second reference value, the control circuitry is operative to delay the switching timing of the switch avoid switching the switch during the first operational phase.

5. The DC/DC converter according to claim 4, wherein the control circuitry is configured to add values to the counter for additional counts, the added value substantially covering a time period of the first operational phase of the load device.

6. The DC/DC converter according to claim 5, wherein the counter is configured to additionally count the added values in a next half period.

7. The DC/DC converter according to claim 2, wherein when the counter value indicates a value between the second reference value and the end value the control circuitry is operative to add a delay to place the switching timing of the switch in the DC/DC converter into the first operational phase.

8. The DC/DC converter according to claim 2, further comprising a second input terminal coupled to the load device to receive a status signal from the load device, the status signal indicating the first operational phase, wherein when the counter value indicates a value between the first reference value and the second reference value, the control circuitry is operative to monitor the status signal from the load circuit to determine the switching timing of the switch.

9. The DC/DC converter according to claim 8, wherein the control circuitry is configured to add a delay time which is the same as that of the current period to a subsequent period.

10. The DC/DC converter according to claim 1, wherein the load device is an analog to digital converter, and the first operational phase is a time period of sampling an analog input and converting the sampled analog input.

11. A device for controlling a transition timing of a switching DC/DC converter for providing power to a load device, the load device having a first operational phase that is sensitive to external noise and a second operational phase is immune to the external noise, the device comprising:

a first input terminal coupled to an external device to receive a start signal of an operation of the load device;

a second input terminal coupled to the load device to receive a status signal from the load device, the status signal indicating the first operational phase; and control circuitry configured to monitor the start signal and the status signal to avoid transitioning an output of the switching DC/DC converter during the first operational phase.

12. The apparatus according to claim 11, wherein responsive to the start signal, the control circuitry is operative to monitor the status signal from the load circuit to determine the transition timing of a switching DC/DC converter.

13. The device according to claim 11, wherein the control circuitry is configured to add a delay time which is the same as that of the current period to a subsequent period.

14. The device according to claim 11, wherein the load device is an analog to digital converter, and the first operational phase is a time period of sampling an analog input and converting the sampled analog input.

15. A method for controlling a switch in a switching DC/DC converter that provides power to a load device, the switch controlling current in a coil in the DC/DC converter, the load device having a first operational phase that is sensitive to external injected noise and a second operational phase that is immune to the external injected noise, the method comprising:

receiving a start signal of the first operational phase for the load device;

responsive to the start signal, controlling the switch to avoid switching the switch during the first operational phase; and a counter incrementing or decrementing a counter value and comparing the counter value to references values to determine when to switch the switch to avoid the first operational phase.

16. A method for controlling a transition timing of a switching DC/DC converter for providing power to a load device, the load device having a first operational phase that is sensitive to external noise and a second operational phase is immune to the external noise, the method comprising:

receiving a start signal of an operation of the load device;

receiving a status signal from the load device, the status signal indicating the first operational phase; and monitoring the start signal and the status signal, and in response thereto avoiding transitioning an output of the switching DC/DC converter during the first operational phase.

\* \* \* \* \*